(12) United States Patent
Lee et al.

(10) Patent No.: US 10,076,036 B2
(45) Date of Patent: Sep. 11, 2018

(54) MULTILAYER CAPACITOR WITH VIA ELECTRODES INTERCONNECTING INTERNAL ELECTRODES AND BOARD HAVING THE SAME

(71) Applicant: SAMSUNG ELECTRO-MECHANICS CO., LTD., Suwon-si, Gyeonggi-do (KR)

(72) Inventors: Kyo Kwang Lee, Suwon-si (KR); Jin Kyung Joo, Suwon-si (KR); Chang Su Kim, Suwon-si (KR); Ho Jun Lee, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/591,619

(22) Filed: May 10, 2017

(65) Prior Publication Data

US 2018/0035545 A1   Feb. 1, 2018

(30) Foreign Application Priority Data

Jul. 27, 2016   (KR) .................. 10-2016-0095711

(51) Int. Cl.
*H05K 1/18*   (2006.01)
*H05K 1/11*   (2006.01)
(Continued)

(52) U.S. Cl.
CPC .............. *H05K 1/181* (2013.01); *H01G 4/012* (2013.01); *H01G 4/018* (2013.01); *H01G 4/232* (2013.01);
(Continued)

(58) Field of Classification Search
None
See application file for complete search history.

(56) References Cited

U.S. PATENT DOCUMENTS 5,892,415 A * 4/1999 Okamura ............ H01P 1/20345
                                                    333/175
6,045,893 A * 4/2000 Fukushima ......... H01F 17/0013
                                                    174/255
(Continued)

FOREIGN PATENT DOCUMENTS

JP       2010-087260 A     4/2010
KR       10-1376839 B1     3/2014
KR    10-2016-0000753 A    1/2016

*Primary Examiner* — Dimary Lopez Cruz
*Assistant Examiner* — Muhammed Azam
(74) *Attorney, Agent, or Firm* — McDermott Will & Emery LLP

(57) ABSTRACT

A multilayer capacitor includes a capacitor body including dielectric layers and a plurality of first and second internal electrodes alternately disposed with one of the dielectric layers interposed between each pair of adjacent first and second internal electrodes. First and second via electrodes penetrate through the plurality of second internal electrodes to thereby be exposed to a first surface of the capacitor body, and are disposed to be spaced apart from each other. First and second external electrodes are disposed on two side surfaces of the capacitor body and connected to opposing ends of the first internal electrodes, respectively. Third and fourth external electrodes are disposed on the first surface of the capacitor body to be spaced apart from each other, and are connected to end portions of the first and second via electrodes, respectively.

23 Claims, 11 Drawing Sheets

(51) Int. Cl.
*H01G 4/232* (2006.01)
*H01G 4/012* (2006.01)
*H01G 4/018* (2006.01)
*H01G 4/30* (2006.01)

(52) U.S. Cl.
CPC .............. *H01G 4/30* (2013.01); *H05K 1/111* (2013.01); *H05K 2201/10015* (2013.01)

(56) References Cited

U.S. PATENT DOCUMENTS

| | | | |
|---|---|---|---|
| 6,185,091 B1* | 2/2001 | Tanahashi | H01G 4/232 361/524 |
| 6,327,134 B1* | 12/2001 | Kuroda | H01G 4/232 361/303 |
| 6,549,395 B1* | 4/2003 | Naito | H01G 4/30 361/306.1 |
| 6,606,237 B1* | 8/2003 | Naito | H01G 4/232 361/303 |
| 8,050,012 B2* | 11/2011 | Lee | H01G 4/005 361/303 |
| 9,281,126 B2* | 3/2016 | Park | H01G 4/30 |
| 9,318,260 B2* | 4/2016 | Fujii | H01G 2/065 |
| 9,460,856 B2* | 10/2016 | Park | H01G 4/30 |
| 9,653,212 B2* | 5/2017 | Lee | H01G 4/30 |
| 9,659,710 B2* | 5/2017 | Park | H01G 4/01 |
| 9,728,334 B2* | 8/2017 | Lee | H01G 4/12 |
| 2002/0005541 A1* | 1/2002 | Park | H01C 1/148 257/306 |
| 2002/0063611 A1* | 5/2002 | Tojyo | H03H 7/09 333/185 |
| 2002/0071238 A1* | 6/2002 | Kuroda | H01G 4/232 361/306.1 |
| 2003/0227738 A1* | 12/2003 | Togashi | H01G 4/232 361/306.1 |
| 2006/0279903 A1* | 12/2006 | Togashi | H01G 4/232 361/303 |
| 2008/0107873 A1* | 5/2008 | Kuwajima | H01G 2/065 428/195.1 |
| 2008/0225463 A1* | 9/2008 | Takashima | H01G 4/232 361/306.3 |
| 2009/0059469 A1* | 3/2009 | Lee | H01G 4/012 361/306.2 |
| 2009/0141421 A1* | 6/2009 | Togashi | H01G 4/232 361/302 |
| 2010/0149769 A1* | 6/2010 | Lee | H01G 2/065 361/768 |
| 2012/0028787 A1* | 2/2012 | Miyauchi | C04B 35/10 501/153 |
| 2012/0275128 A1* | 11/2012 | Takada | H05K 1/0212 361/760 |
| 2013/0062994 A1* | 3/2013 | Ogawa | H01F 17/0013 310/311 |
| 2014/0104750 A1 | 4/2014 | Ahn et al. | |
| 2014/0311787 A1* | 10/2014 | Park | H01G 4/385 174/260 |
| 2014/0368968 A1* | 12/2014 | Lee | H01G 4/005 361/301.4 |
| 2015/0022937 A1* | 1/2015 | Park | H01G 4/30 361/270 |
| 2015/0043185 A1* | 2/2015 | Ahn | H05K 1/111 361/767 |
| 2015/0047890 A1* | 2/2015 | Lee | H01G 4/30 174/260 |
| 2015/0116891 A1* | 4/2015 | Park | H01G 4/40 361/270 |
| 2015/0124371 A1* | 5/2015 | Park | H01G 4/012 361/301.4 |
| 2015/0302991 A1* | 10/2015 | Choi | H01G 4/30 174/260 |
| 2015/0303890 A1* | 10/2015 | Taniguchi | H03H 7/075 333/185 |
| 2015/0380167 A1 | 12/2015 | Lim et al. | |
| 2018/0082792 A1* | 3/2018 | Satoh | H01G 4/35 |

\* cited by examiner

MULTILAYER CAPACITOR WITH VIA ELECTRODES INTERCONNECTING INTERNAL ELECTRODES AND BOARD HAVING THE SAME

CROSS-REFERENCE TO RELATED APPLICATION(S)

This application claims benefit of priority to Korean Patent Application No. 10-2016-0095711, filed on Jul. 27, 2016 in the Korean Intellectual Property Office, the disclosure of which is incorporated herein by reference in its entirety.

BACKGROUND

1. Field

The present disclosure relates to a multilayer capacitor and a board having the same.

2. Description of Related Art

A multilayer capacitor is a type of multilayer electronic component that is commonly mounted on a circuit board of an electronic product, such as an image device or, for example, a liquid crystal display (LCD), a plasma display panel (PDP), and the like, a computer, a personal digital assistant (PDA), a cellular phone, and the like, to serve to charge or discharge electricity therein or therefrom.

The multilayer capacitor described above may advantageously be used as a component of various types of electronic apparatuses due to advantages such as a small size, a high capacitance, and ease of mounting.

Recent efforts have been made to decrease the impedance of multilayer capacitors in order to provide improvements of performance, increases in used current, to enable high performance, decreases in used voltage, to increase usage time, and slimness.

In order to decrease impedance, a method of connecting a large number of multilayer capacitors in parallel has been used, but, in this case, the method disadvantageously requires an increased mounting area and increased manufacturing time.

Therefore, recently, research has been conducted into technology that can change the structure of the multilayer capacitor so as to decrease equivalent series inductance (ESL) characteristics.

Similar to the multilayer capacitor having low ESL characteristics described above, a low inductance ceramic capacitor (LICC) has been disclosed in which a current path is decreased by changing a length direction and a width direction. Additionally, a multi-terminal type super low inductance capacitor (SLIC) has been disclosed in which low ESL is implemented by increasing a current path and offsetting magnetic fluxes. Furthermore, a product having a 3-terminal structure has been disclosed to which these two principles are applied.

However, the LICC and the capacitor having the 3-terminal structure may be implemented only at a size equal to or larger than a 1005 size due to pattern shapes of internal electrodes and an application method of external electrodes, and the SLIC may be implemented only at a size equal to or larger than a 1608 size to enable the forming of four terminals.

SUMMARY

An aspect of the present disclosure may provide a multilayer capacitor capable of being manufactured at a size smaller than 1005 size while decreasing ESL, and a board having the same.

According to an aspect of the present disclosure, a multilayer capacitor may include a capacitor body including dielectric layers and a plurality of first and second internal electrodes alternately disposed with one of the dielectric layers interposed between each pair of adjacent first and second internal electrodes. The capacitor body has first and second surfaces opposing each other, third and fourth surfaces connected to the first and second surfaces and opposing each other, and fifth and sixth surfaces connected to the first and second surfaces and the third and fourth surfaces and opposing each other. Opposing ends of the first internal electrodes are exposed to the third and fourth surfaces, respectively. First and second via electrodes penetrate through the plurality of second internal electrodes to thereby be exposed to the first surface of the capacitor body, and are disposed to be spaced apart from each other. First and second external electrodes are disposed on the third and fourth surfaces of the capacitor body and respectively connected to opposing ends of the first internal electrodes. Third and fourth external electrodes are disposed on the first surface of the capacitor body to be spaced apart from each other, and connected to end portions of the first and second via electrodes, respectively.

According to an aspect of the present disclosure, a multilayer capacitor may include a capacitor body including dielectric layers and a plurality of first and second internal electrodes alternately disposed with one of the dielectric layers interposed between each pair of adjacent first and second internal electrodes. The capacitor body has first and second surfaces opposing each other, third and fourth surfaces connected to the first and second surfaces and opposing each other, and fifth and sixth surfaces connected to the first and second surfaces and the third and fourth surfaces and opposing each other. First and second via electrodes penetrate through the plurality of second internal electrodes to thereby be exposed to the first surface of the capacitor body, and are disposed to be spaced apart from each other. Third and fourth via electrodes penetrate through the plurality of first internal electrodes to thereby be exposed to the first surface of the capacitor body, and are disposed to be spaced apart from each other. First and second external electrodes are disposed on the first surface of the capacitor body to be spaced apart from each other, and are connected to end portions of the third and fourth via electrodes, respectively. Third and fourth external electrodes are disposed on the first surface of the capacitor body to be spaced apart from each other, and are connected to end portions of the first and second via electrodes, respectively.

According to another aspect of the present disclosure, a multilayer capacitor has a capacitor body including dielectric layers and pluralities of first and second internal electrodes alternately stacked with one of the dielectric layers interposed between each pair of adjacent first and second internal electrodes. First, second, third, and fourth external electrodes are disposed on at least one surface of the capacitor body, the first and second external electrodes electrically connected to the first internal electrodes and the third and fourth external electrodes electrically connected to the second internal electrodes. The capacitor body includes first and second via electrodes spaced apart from each other in the capacitor body. Each of the second internal electrodes of the plurality of second internal electrodes contacts both of the first and second via electrodes. The third and fourth external electrodes are disposed on a same surface of the capacitor body to be spaced apart from each other, and respectively contact an end portion of the first and second via electrodes.

According to a further aspect of the present disclosure, a multilayer capacitor has a capacitor body including dielectric layers and pluralities of first and second internal electrodes alternately stacked with one of the dielectric layers interposed between each pair of adjacent first and second internal electrodes. The capacitor body includes first and second via electrodes disposed in the capacitor body and each contacting each of the second internal electrodes, the first and second via electrodes being spaced apart from each other along a first direction orthogonal to a stacking direction of the dielectric layers. The first internal electrodes are interconnected by first and second conductors each contacting each of the first internal electrodes, the first and second conductors being spaced apart from each other along a second direction orthogonal to the stacking direction of the dielectric layers and to the first direction.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
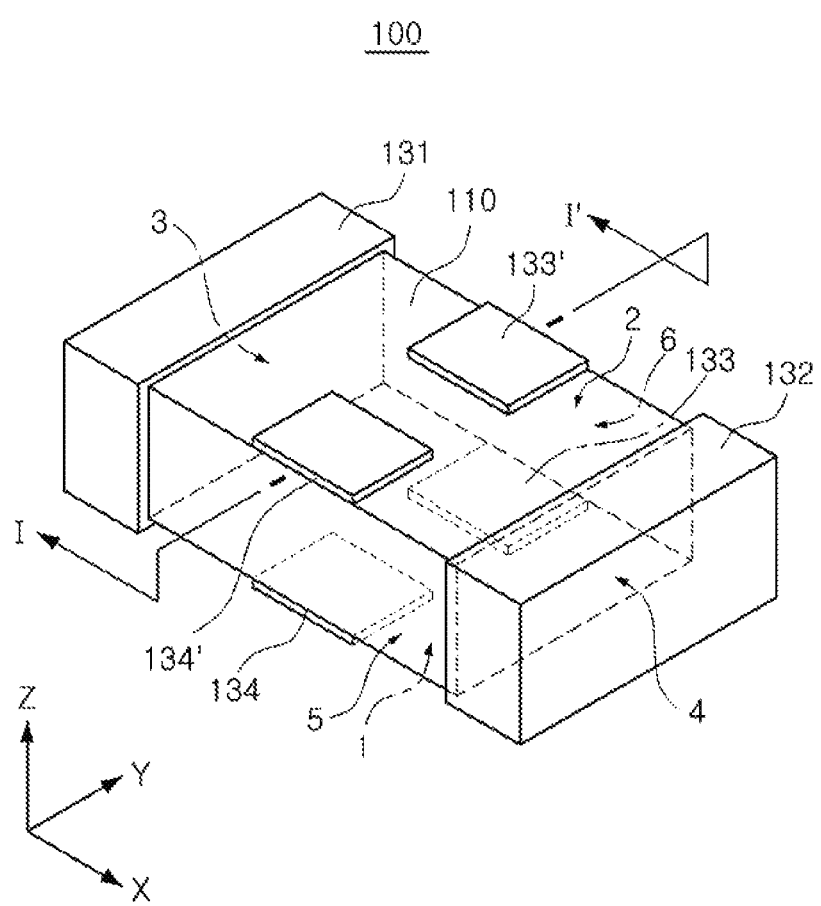
FIG. 1 is a perspective view schematically illustrating a multilayer capacitor according to a first exemplary embodiment.

Hereinafter, exemplary embodiments in the present disclosure will be described in detail with reference to the accompanying drawings.

Directions of a capacitor body will be defined in order to clearly describe exemplary embodiments in the present disclosure. X, Y, and Z directions illustrated in the accompanying drawings refer to a length direction, a width direction, and a thickness direction, respectively. Here, the thickness direction (Z) may be the same as a stacking direction in which dielectric layers and internal electrodes are stacked.

Further, in the present exemplary embodiment, for convenience of explanation, the two surfaces of a capacitor body 110 opposing each other in the Z direction will be defined as first and second surfaces 1 and 2, the two surfaces of the capacitor body 110 opposing each other in the X direction and connecting ends of the first and second surfaces 1 and 2 to each other will be defined as third and fourth surfaces 3 and 4, and the two surfaces of the capacitor body 110 opposing each other in the Y direction and connecting ends of the first and second surfaces 1 and 2 to each other and connecting ends of the third and fourth surfaces 3 and 4 to each other, respectively, will be defined as fifth and sixth surfaces 5 and 6. Here, the first surface 1 may be the same as a mounting surface.

Multilayer Capacitor

Figure 2A:
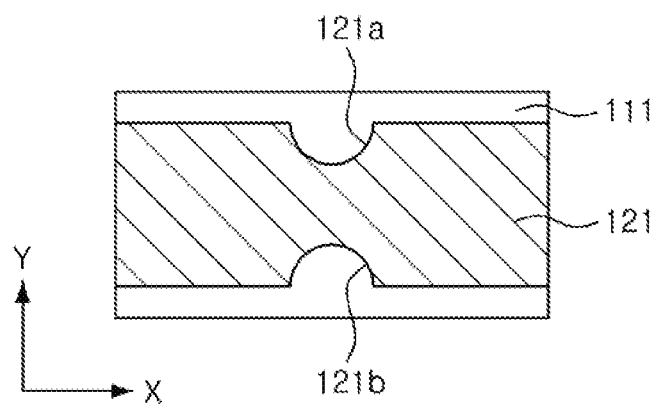
FIGS. 2A and 2B are plan views respectively illustrating first and second internal electrodes in the multilayer capacitor according to the first exemplary embodiment.
Figure 2B:
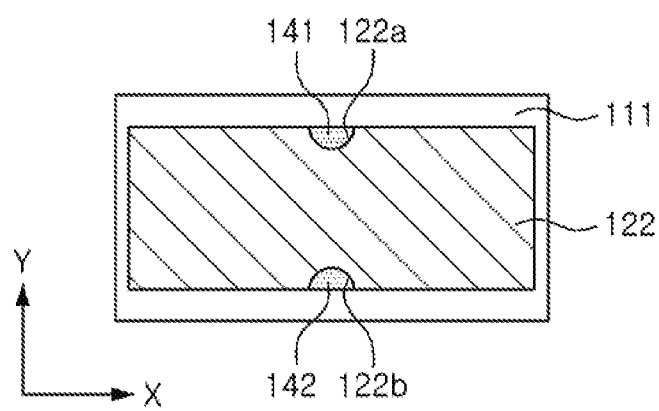
Figure 3:
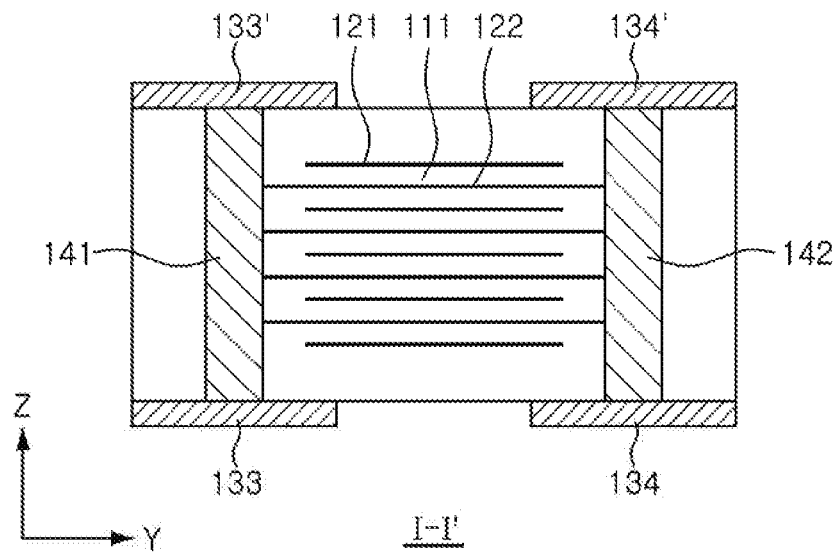
FIG. 3 is a cross-sectional view taken along line I-I' of FIG. 1.
Figure 4:
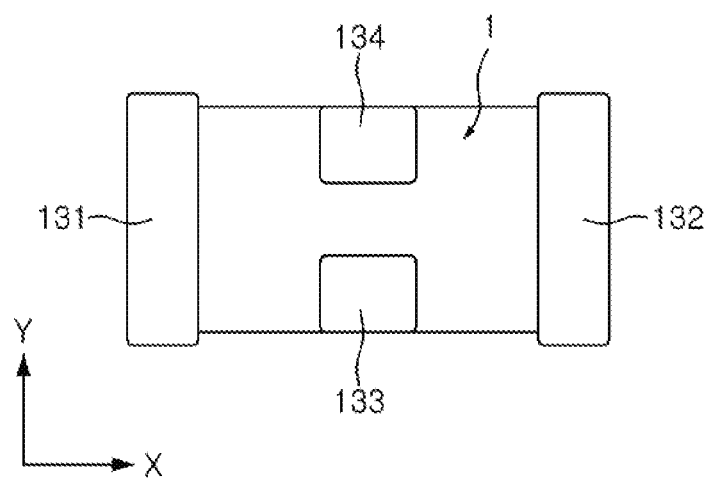
FIG. 4 is a bottom view of FIG. 1.

FIG. 1 is a perspective view schematically illustrating a multilayer capacitor according to a first exemplary embodiment, FIGS. 2A and 2B are plan views illustrating first and second internal electrodes in the multilayer capacitor according to the first exemplary embodiment, respectively, FIG. 3 is a cross-sectional view taken along line I-I' of FIG. 1, and FIG. 4 is a bottom view of FIG. 1.

Referring to FIGS. 1, 2A, 2B, 3, and 4, a multilayer capacitor 100 according to the first exemplary embodiment may include a capacitor body 110 including dielectric layers 111 and a plurality of first and second internal electrodes 121 and 122, first and second via electrodes 141 and 142, and first to fourth external electrodes 131 to 134.

Here, the first and second via electrodes 141 and 142 may be disposed so that lower ends thereof penetrate through the plurality of second internal electrodes 122 in the Z direction to thereby be exposed to the first surface 1 of the capacitor body 110, and are spaced apart from each other in the Y direction of the capacitor body 110.

The capacitor body 110 may be formed by stacking a plurality of dielectric layers 111, and may have a substantially hexahedral shape as illustrated in FIG. 1, but is not particularly limited thereto.

However, a shape and a dimension of the capacitor body 110 and the number of stacked dielectric layers 111 are not limited to those illustrated in the accompanying drawings.

Further, the dielectric layers 111 may be in a sintered state, and adjacent dielectric layers 111 may be integrated with each other so that boundaries therebetween are not readily apparent without use of a scanning electron microscope (SEM).

The capacitor body 110 as described above may include an active region including the first and second internal electrodes 121 and 122 as a part contributing to forming capacitance of the capacitor and cover regions disposed on upper and lower surfaces of the active region in the Z direction as margin parts.

The active region may be formed by repeatedly stacking a plurality of first and second internal electrodes 121 and 122 with one of the dielectric layers 111 interposed between each pair of adjacent first and second internal electrodes 121 and 122.

Here, a thickness of the dielectric layer 111 may be arbitrarily changed depending on a capacitance design of the multilayer capacitor 100.

In addition, the dielectric layer 111 may contain ceramic powders having high permittivity, for example, barium titanate ($BaTiO_3$) based powders or strontium titanate ($SrTiO_3$) based powders. However, a material of the dielectric layer 111 is not limited thereto.

Further, the dielectric layer 111 may further contain at least one of ceramic additives, organic solvents, plasticizers, binders, dispersants, and the like, if necessary, in addition to the ceramic powders.

The cover regions may be formed of the same material as that of the dielectric layer 111 and have the same configuration as that of the dielectric layer 111 except that the cover regions are positioned in upper and lower portions of the capacitor body 110 in the Z direction, respectively, and do not include the internal electrodes.

The cover regions as described above may be prepared by stacking a single or two or more dielectric layers 111 on and below upper and lower portions of the active region in the Z direction, respectively, and may basically serve to prevent the first and second internal electrodes 121 and 122 from being damaged by physical or chemical stress.

The first and second internal electrodes 121 and 122 may be electrodes having different polarities from each other.

The first and second internal electrodes 121 and 122 may be alternately disposed with one of the dielectric layers 111 interposed between each pair of adjacent first and second internal electrodes 121 and 122 in the capacitor body 110 in the Z direction. An overlapping area between the first and second internal electrodes 121 and 122 in the Z direction may be associated with capacitance of the capacitor.

Further, the first and second internal electrodes 121 and 122 may be formed by printing a conductive paste containing a conductive metal on the dielectric layers 111 at a predetermined thickness, and insulated from each other by each of the dielectric layers 111 interposed therebetween.

The conductive metal contained in the conductive paste may be, for example, nickel (Ni), copper (Cu), palladium (Pd), or an alloy thereof. However, the conductive metal contained in the conductive paste is not limited thereto.

In addition, a method of printing the conductive paste may be a screen printing method, a gravure printing method, or the like. However, the method of printing the conductive paste according to the present disclosure is not limited thereto.

According to the first exemplary embodiment, the capacitor body 110 may include first and second via grooves 122a and 122b.

The first and second via grooves 122a and 122b may be formed by a laser punching or mechanical punching method.

The first and second via grooves 122a and 122b may be formed by punching in the Z direction, which is the stacking direction of the dielectric layers 111, so that both ends of the second internal electrodes 122 in the Y direction are partially removed, respectively.

Here, the first and second via grooves 122a and 122b may face or, in some examples be exposed to, the first and second surfaces 1 and 2 of the capacitor body 110.

Although a case in which the first and second via grooves 122a and 122b have a semi-circular shape is illustrated in the present exemplary embodiment, the shape of the first and second via grooves 122a and 122b is not limited thereto. If necessary, the first and second via grooves 122a and 122b may have various shapes such as circles, quadrangles, triangles, or the like.

The first and second via electrodes 141 and 142 may be formed by filling the first and second via grooves 122a and 122b, respectively, with a conductive material or formed by castellation.

The second internal electrode 122 may be disposed to be spaced apart from ends of the capacitor body 110.

Opposite ends of the first internal electrode 121 may be exposed to the third and fourth surfaces 3 and 4 of the capacitor body 110, respectively.

Further, first and second via separation grooves 121a and 121b may be formed in the first internal electrode 121 to be larger than the first and second via grooves 122a and 122b, and may be located at positions in both ends of the first internal electrodes 121 in the Y direction corresponding to positions of the first and second via grooves 122a and 122b.

Therefore, the first and second via electrodes 141 and 142 may contact the first and second via grooves 122a and 122b to electrically connect the plurality of second internal electrodes 122 to each other in the Z direction, and may be spaced apart from the first internal electrodes 121 by the first and second via separation grooves 121a and 121b such that the first and second via electrodes 141 and 142 may not be electrically connected to the first internal electrodes 121.

The first and second external electrodes 131 and 132 may be disposed on the third and fourth surfaces 3 and 4 of the capacitor body 110, respectively, and respectively connected to opposing ends of the first internal electrodes 121.

Here, the first and second external electrodes 131 and 132 may be extended from the third and fourth surfaces 3 and 4 of the capacitor body 110 to portions of the first surface 1 of the capacitor body 110.

In addition, if necessary, the first and second external electrodes 131 and 132 may be extended to portions of the second surface 2 of the capacitor body 110 and additionally extended to portions of the fifth and sixth surfaces 5 and 6 of the capacitor body 110, respectively.

Third and fourth external electrodes 133 and 134 may be disposed on the first surface 1 of the capacitor body 110 to be spaced apart from each other in the Y direction, and connected to exposed lower end portions of the first and second via electrodes 141 and 142, respectively.

Meanwhile, when the first and second via electrodes 141 and 142 are exposed to the second surface 2 of the capacitor body 110, third and fourth external electrodes 133' and 134' may be additionally disposed on the second surface 2 of the capacitor body 110 to be spaced apart from each other in the Y direction and connected to exposed upper end portions of the first and second via electrodes 141 and 142, respectively.

The third and fourth external electrodes 133 and 134 may be formed together with the first surface 1 of the capacitor body 110 during the stacking, or formed on a compressed bar by a printing method.

When the second internal electrodes 122 are electrically connected to the external electrodes 133 and 134 formed on the mounting surface 1 of the capacitor body 110 through the via electrodes 141 and 142 formed in the stacking direction Z of the dielectric layers 111 as described above, an overlapping area between the first and second internal electrodes 121 and 122 having different polarities may be increased, such that capacitance of a product may be increased at the same size without thinning thicknesses of the dielectric layers 111 and the internal electrodes 121 and 122 to increase the number of stacked dielectric layers 111, or increasing permittivity.

For example, the overlapping area between the first and second internal electrodes may be increased by at most 137% as compared to a 2-terminal capacitor in which external electrodes are formed on both ends of a capacitor body in a length direction.

Therefore, ESL may be decreased, and a size of the product may be decreased to be smaller than a 1005 size, such that at the time of mounting the multilayer capacitor on a circuit board, a mounting area may be significantly decreased.

Figure 5A:
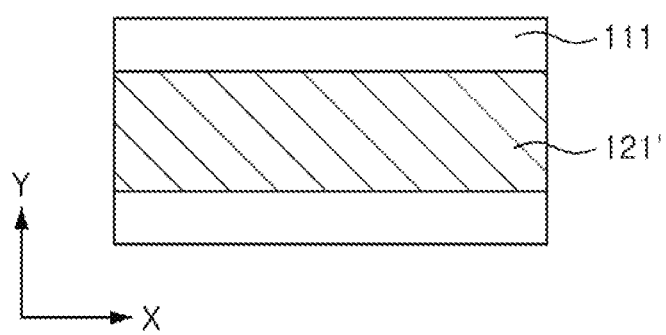
FIGS. 5A and 5B are plan views respectively illustrating first and second internal electrodes in a multilayer capacitor according to a second exemplary embodiment.
Figure 5B:
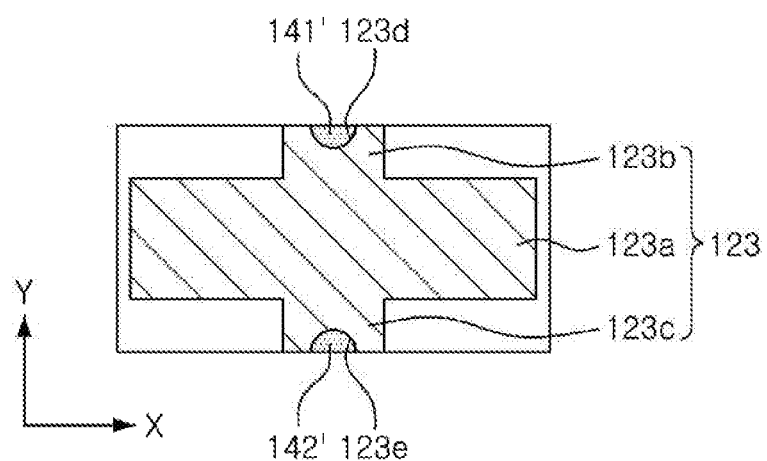
Figure 6:
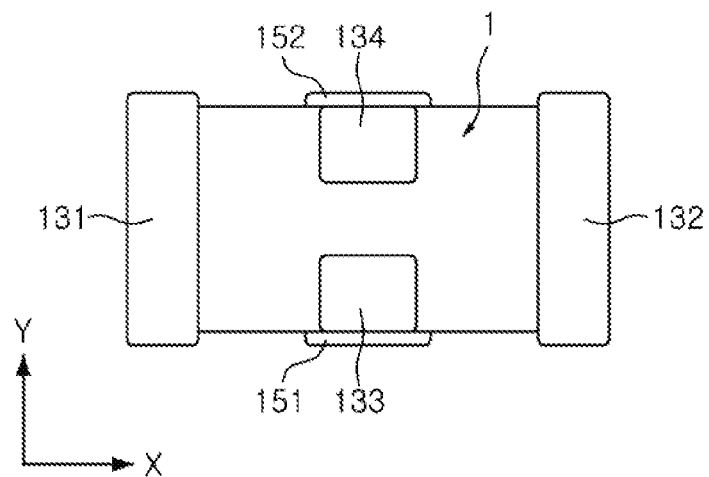
FIG. 6 is a bottom view of the multilayer capacitor according to the second exemplary embodiment.

FIGS. 5A and 5B are plan views illustrating first and second internal electrodes in a multilayer capacitor according to a second exemplary embodiment in the present disclosure, respectively, and FIG. 6 is a bottom view of the multilayer capacitor according to the second exemplary embodiment.

Here, since structures of dielectric layers 111 and first to fourth external electrodes 131 to 134 are similar to those in the first exemplary embodiment described above, a detailed description thereof will be omitted in order to avoid an overlapping description.

Referring to FIGS. 5A, 5B, and 6, first and second via grooves 123d and 123e may be formed in fifth and sixth surfaces 5 and 6 of a capacitor body 110 to extend in a Z direction, which is a stacking direction of the dielectric layers 111, so that ends of first and second lead portions 123b and 123c are partially removed, respectively.

First and second via electrodes 141' and 142' may be formed by filling the first and second via grooves 123d and 123e, respectively, with a conductive material or formed by castellation.

The second internal electrodes 123 may include a body portion 123a and the first and second lead portions 123b and 123c.

The body portion 123a is a portion disposed to be spaced apart from ends (or sides surfaces) of the capacitor body 110 and overlapping a first internal electrode 121'.

The first and second lead portions 123b and 123c may be portions extended from the body portion 123a to extend to and be exposed to the fifth and sixth surfaces 5 and 6 of the capacitor body 110, respectively.

The first internal electrode 121' may be disposed so that the first internal electrode 121' does not overlap or contact the first and second via grooves 123d and 123e in the Z direction.

To this end, the first internal electrode 121' may be formed to have a width narrower than that of the body portion 123a of the second internal electrode 123.

Therefore, the first and second via electrodes 141' and 142' may contact the first and second via grooves 123d and 123e to electrically connect a plurality of second internal electrodes 123 (including the first and second lead portions 123b and 123c) to each other in the Z direction, and may be spaced apart from the first internal electrode 121', such that the first and second via electrodes 141' and 142' may not be electrically connected to the first internal electrode 121.

The first and second external electrodes 131 and 132 may be disposed on third and fourth surfaces 3 and 4 of the capacitor body 110, respectively, and connected to opposing ends of the first internal electrode 121', respectively.

Third and fourth external electrodes 133 and 134 may be disposed on a first surface 1 of the capacitor body 110 to be spaced apart from each other in a Y direction, and connected to exposed lower end portions of the first and second via electrodes 141' and 142', respectively.

In addition, insulating parts 151 and 152 may be formed on the fifth and sixth surfaces 5 and 6 of the capacitor body 110.

The insulating parts 151 and 152 may be formed by molding the fifth and sixth surfaces 5 and 6 of the capacitor body 110 with a non-conductive material, or separately attaching the desired number of separate ceramic sheets, or the like, on the fifth and sixth surfaces 5 and 6 of the capacitor body 110, but a method of forming the insulating layers 151 and 152 is not limited thereto.

Here, the insulating parts 151 and 152 may be formed of at least one of an insulating resin, an insulating ceramic, and an insulating resin and a filler, but a material of the insulating parts 151 and 152 is not limited thereto.

The insulating parts 151 and 152 as described above may cover portions of the first and second lead portions 123b and 123c exposed to the fifth and sixth surfaces 5 and 6 of the capacitor body 110 and portions of the first and second via electrodes 141' and 142' exposed to the fifth and sixth surfaces 5 and 6 of the capacitor body 110 to insulate the exposed portions of the first and second lead portions 123b and 123c and the exposed portions of the first and second via electrodes 141' and 142'.

Further, the insulating parts 151 and 152 may improve durability of the capacitor body 110 and further secure margins having a predetermined thickness, thereby serving to improve reliability of the capacitor.

Meanwhile, since the insulating parts 151 and 152 are formed after forming the capacitor body 110, in a case of significantly decreasing a thickness of the insulating parts 151 and 152 in a range in which an insulation property, durability of the capacitor body 110, and reliability of the capacitor are maintained at a predetermined level, a size of a product may be significantly decreased.

Figure 7:
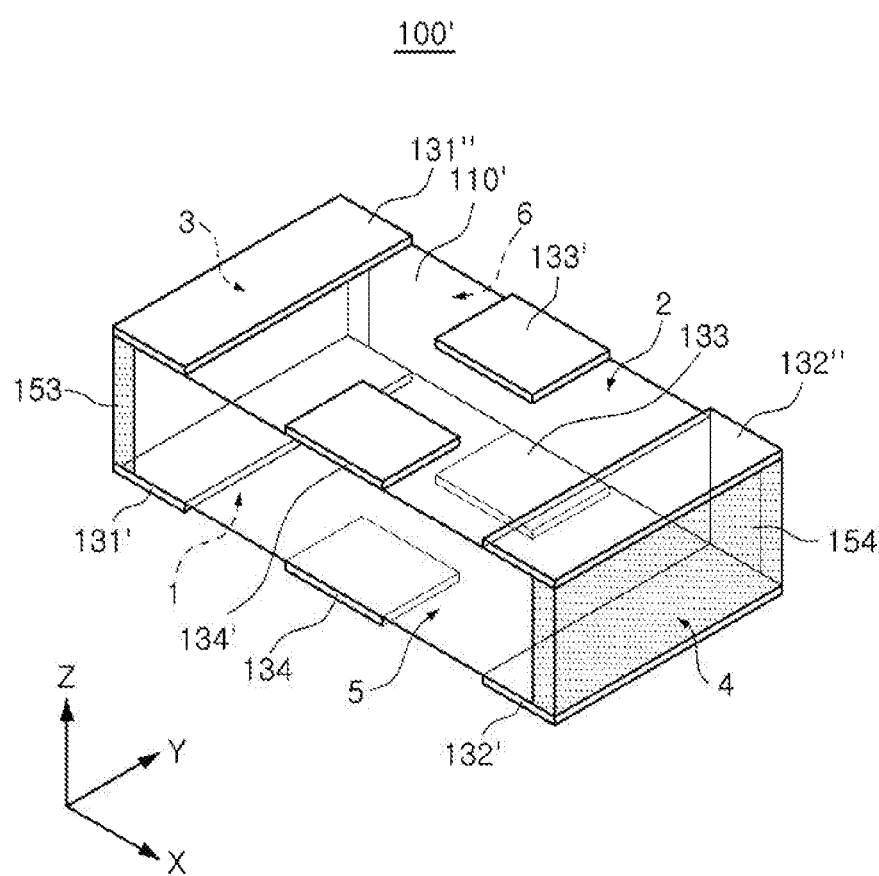
FIG. 7 is a perspective view schematically illustrating a multilayer capacitor according to a third exemplary embodiment.
Figure 8A:
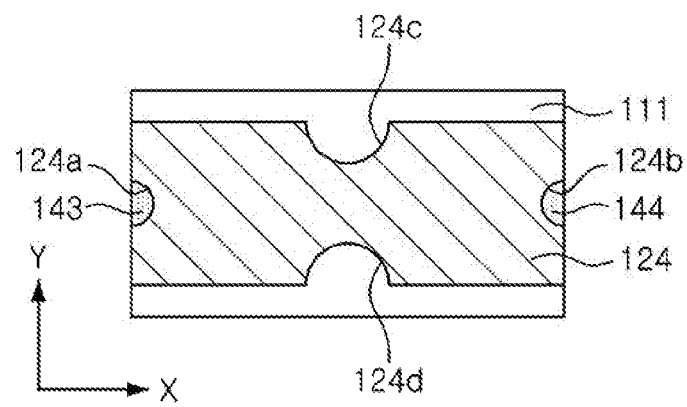
FIGS. 8A and 8B are plan views respectively illustrating first and second internal electrodes in the multilayer capacitor according to the third exemplary embodiment.
Figure 8B:
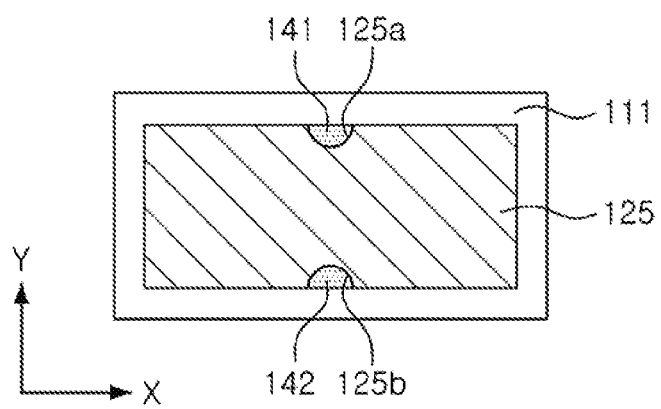
Figure 9:
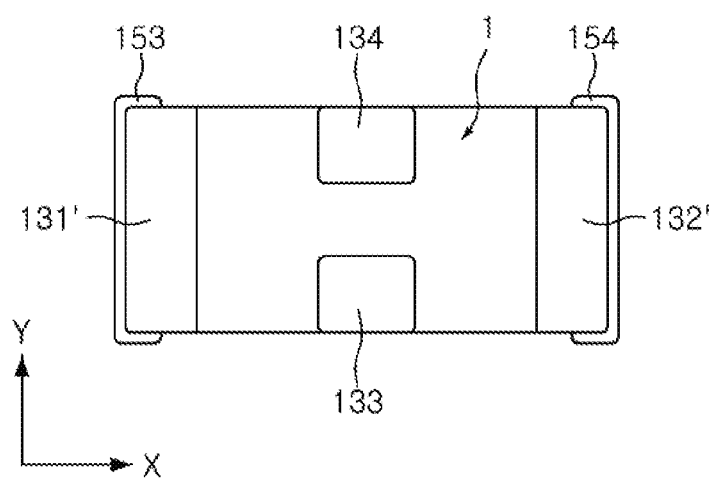
FIG. 9 is a bottom view of FIG. 7.
Figure 10:
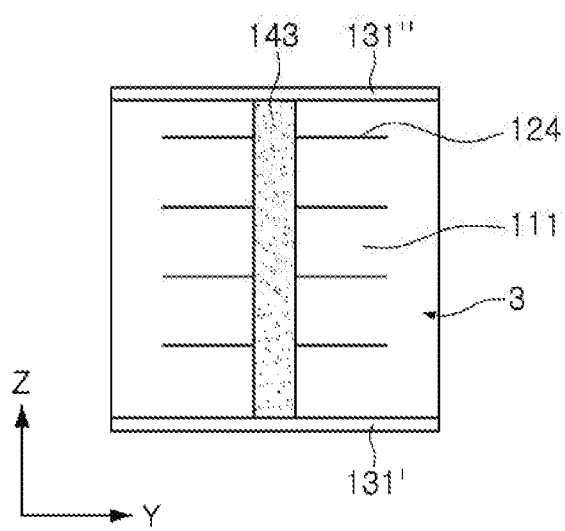
FIG. 10 is a side view illustrating one surface of a capacitor body in a length direction in a state in which insulating parts are removed in FIG. 7.

FIG. 7 is a perspective view schematically illustrating a multilayer capacitor according to a third exemplary embodiment, FIGS. 8A and 8B are plan views illustrating first and second internal electrodes in the multilayer capacitor according to the third exemplary embodiment, respectively, FIG. 9 is a bottom view of FIG. 7, and FIG. 10 is a side view illustrating one surface of a capacitor body in a length direction in a state in which insulating parts shown in FIG. 7 are removed.

Here, since structures of dielectric layers 111 and third and fourth external electrodes 133 to 134 are similar to those in the first exemplary embodiment described above, a detailed description thereof will be omitted in order to avoid an overlapping description.

Referring to FIGS. 7, 8A, 8B, 9, and 10, first and second via electrodes 141 and 142 may be disposed to penetrate through a plurality of second internal electrodes 125 to thereby be exposed to a first surface 1 of a capacitor body 110', and be spaced apart from each other in a Y direction of the capacitor body 110'.

A multilayer capacitor 100' according to the third exemplary embodiment may further include third and fourth via electrodes 143 and 144.

The third and fourth via electrodes 143 and 144 may be disposed to penetrate through a plurality of first internal electrodes 124 to thereby be exposed to the first surface 1 of the capacitor body 110', and be spaced apart from each other in an X direction of the capacitor body 110'.

In addition, first and second external electrodes 131' and 132' may be disposed on the first surface 1 of the capacitor body 110' to be spaced apart from each other in the X direction, and connected to lower end portions of the third and fourth via electrodes 143 and 144, respectively.

The third and fourth external electrodes 133 and 134 may be disposed on the first surface 1 of the capacitor body 110 to be spaced apart from each other in the Y direction, and connected to lower end portions of the first and second via electrodes 141 and 142, respectively.

Meanwhile, when the first and second via electrodes 141 and 142 are exposed to a second surface 2 of the capacitor body 110', third and fourth external electrodes 133' and 134' may be additionally disposed on the second surface 2 of the capacitor body 110' to be spaced apart from each other in the Y direction, and connected to exposed upper end portions of the first and second via electrodes 141 and 142, respectively.

In addition, first and second external electrodes 131" and 132" may be additionally disposed on the second surface 2 of the capacitor body 110' to be spaced apart from each other in the X direction, and connected to exposed upper end portions of the third and fourth via electrodes 143 and 144, respectively.

First and second via grooves 125a and 125b may be formed to extend through the capacitor body 110' in a Z direction, which is a stacking direction of the dielectric layers 111, so that both ends of the second internal electrodes 125 in the Y direction are partially removed, respectively.

Third and fourth via grooves 124a and 124b may be formed to extend through the capacitor body 110' in the Z direction, which is the stacking direction of the dielectric layers 111, so that both ends of the first internal electrodes 124 in the X direction are partially removed, respectively.

First to fourth via electrodes 141 to 144 may be formed by filling the first to fourth via grooves 125a, 125b, 124a, and 124b with a conductive material or formed by castellation, respectively.

The second internal electrodes 125 may be disposed to be spaced apart from ends of the capacitor body 110' and disposed not to overlap or contact the third and fourth via grooves 124a and 124a in the Z direction.

To this end, the second internal electrodes 125 may be formed to have a length less than a length of a portion of the first internal electrode 124 disposed between the third and fourth via grooves 124a and 124b.

Opposing ends of the first internal electrode 124 may be exposed to third and fourth surfaces 3 and 4 of the capacitor body 110', respectively.

Further, first and second via separation grooves 124c and 124d may be formed in the first internal electrode 124 to be larger than the first and second via grooves 125a and 125b and to be disposed at positions in both ends of the first internal electrode 124 in the Y direction corresponding to positions of the first and second via grooves 125a and 125b.

Therefore, the first and second via electrodes 141 and 142 may contact the first and second via grooves 125a and 125b to electrically connect the plurality of second internal electrodes 125 to each other in the Z direction, and may be spaced apart from the first internal electrodes 124 by the first and second via separation grooves 124c and 124d, such that the first and second via electrodes 141 and 142 may not be electrically connected to the first internal electrode 124.

In addition, insulating parts 153 and 154 may be formed on the third and fourth surfaces 3 and 4 of the capacitor body 110'.

The insulating parts 153 and 154 as described above may cover portions of the first internal electrodes 124 exposed to the third and fourth surfaces 3 and 4 of the capacitor body 110' and portions of the third and fourth via electrodes 143 and 144 exposed to the third and fourth surfaces 3 and 4 of the capacitor body 110' to insulate the exposed portions of the first internal electrodes 124 and the exposed portions of the third and fourth via electrodes 143 and 144.

According to the present exemplary embodiment, since the external electrodes are disposed only on the mounting surface 1 of the capacitor body 110', at the time of mounting the multilayer capacitor on a circuit board, a contact area may be decreased, such that a mounting area may be decreased.

Figure 11A:
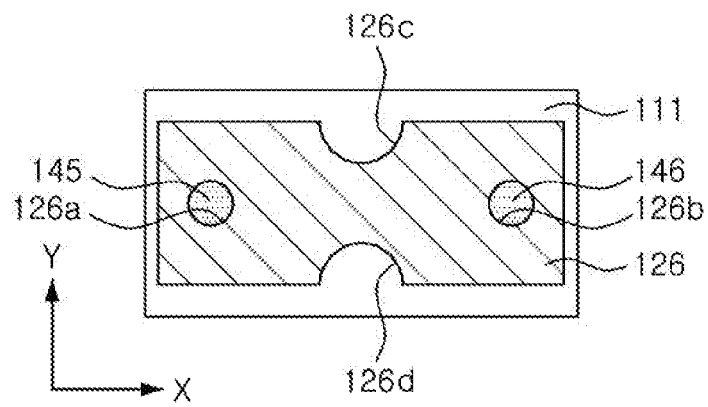
FIGS. 11A and 11B are plan views respectively illustrating first and second internal electrodes in a multilayer capacitor according to a fourth exemplary embodiment.
Figure 11B:
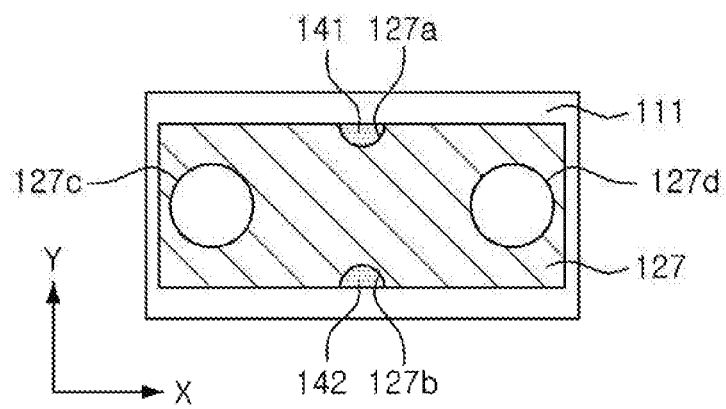
Figure 12:
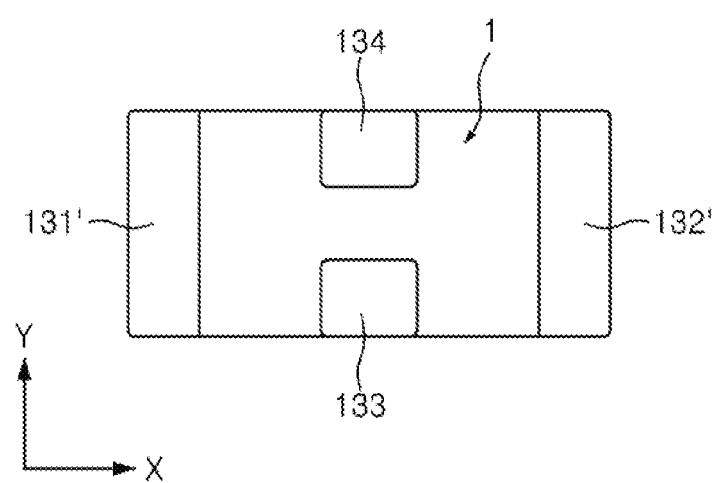
FIG. 12 is a bottom view of the multilayer capacitor according to the fourth exemplary embodiment.

FIGS. 11A and 11B are plan views illustrating first and second internal electrodes 126 and 127 in a multilayer capacitor according to a fourth exemplary embodiment, respectively, and FIG. 12 is a bottom view of the multilayer capacitor according to the fourth exemplary embodiment of the present disclosure.

Here, since structures of dielectric layers 111 and first to fourth external electrodes 131', 132', 133, and 134 are similar to those in the third exemplary embodiment described above, a detailed description thereof will be omitted in order to avoid an overlapping description.

Referring to FIGS. 11A, 11B, and 12, first and second via grooves 127a and 127b may be formed so that both ends of second internal electrodes 127 in a Y direction are partially removed.

Third and fourth via grooves 126a and 126b may be disposed to be spaced apart from each other in an X direction while penetrating through a plurality of first internal electrodes 126.

Although a case in which the third and fourth via grooves 126a and 126b have a circular shape is illustrated and described in the present exemplary embodiment, the shape of the third and fourth via grooves 126a and 126b is not limited thereto. If necessary, the third and fourth via grooves 126a and 126b may have various shapes such as ovals, polygons, or the like.

First to fourth via electrodes 141, 142, 145, and 146 may be formed by filling the first to fourth via grooves 127a, 127b, 126a, and 126b, respectively, with a conductive material or formed by castellation.

The second internal electrode 127 may be disposed to be spaced apart from ends of the capacitor body 110'.

Further, third and fourth via separation grooves 127c and 127d may be formed in the second internal electrodes 127 to be larger than the third and fourth via grooves 126a and 126b and to be located at positions in the second internal electrodes 127 corresponding to the third and fourth via grooves 126a and 126b of the first internal electrodes 126.

The first internal electrodes 126 may be disposed to be spaced apart from the ends of the capacitor body 110'.

Further, first and second via separation grooves 126c and 126d may be formed in the first internal electrodes 126 to be larger than the first and second via grooves 127a and 127b and located at positions in the first internal electrode 126 corresponding to the locations of the first and second via grooves 127a and 127b in the second internal electrodes 127.

Therefore, the first and second via electrodes 141 and 142 may contact the first and second via grooves 127a and 127b to electrically connect the plurality of second internal electrodes 127 to each other in the Z direction, and may be spaced apart from the first internal electrode 126 by the first and second via separation grooves 126c and 126d, such that the first and second via electrodes 141 and 142 may not be electrically connected to the first internal electrode 126.

The third and fourth via electrodes 145 and 146 may contact the third and fourth via grooves 126a and 126b to electrically connect the plurality of first internal electrodes 126 to each other in the Z direction, and may be spaced apart from the second internal electrodes 127 by the third and fourth via separation grooves 127c and 127d, such that the third and fourth via electrodes 145 and 146 may not be electrically connected to the second internal electrodes 127.

According to the present exemplary embodiment, the first and second internal electrodes 126 and 127 may both be disposed at positions spaced inwardly from edges of the capacitor body 110', and thus an effect of preventing cracks and delamination mainly occurring in corners of the capacitor body may be improved.

Figure 13A:
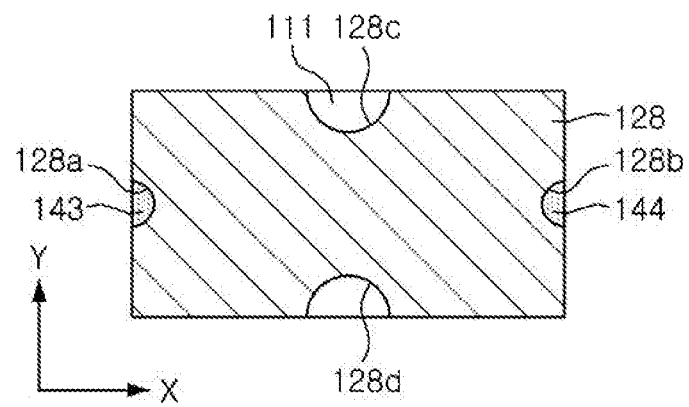
FIGS. 13A and 13B are plan views respectively illustrating first and second internal electrodes in a multilayer capacitor according to a fifth exemplary embodiment.
Figure 13B:
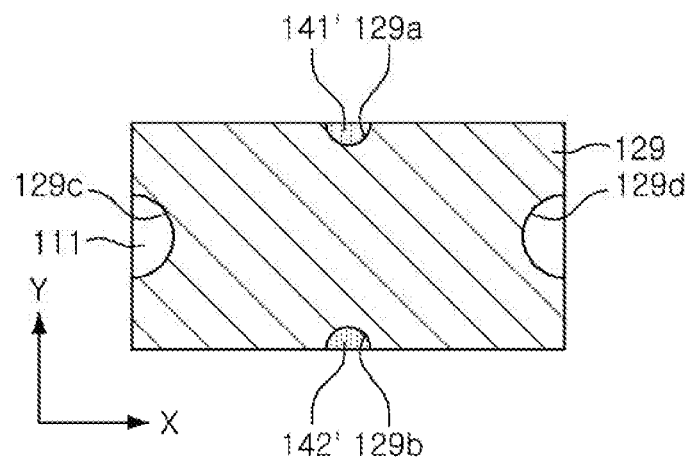
Figure 14:
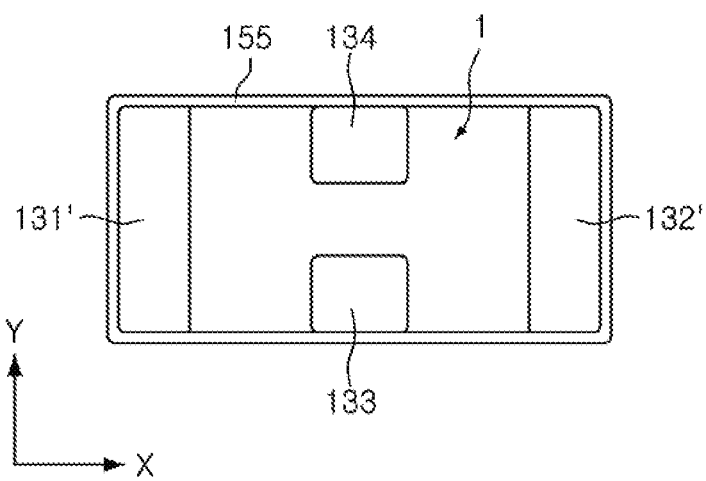
FIG. 14 is a bottom view of the multilayer capacitor according to the fifth exemplary embodiment.

FIGS. 13A and 13B are plan views illustrating first and second internal electrodes 128 and 129 in a multilayer capacitor according to a fifth exemplary embodiment, respectively, and FIG. 14 is a bottom view of the multilayer capacitor according to the fifth exemplary embodiment of the present disclosure.

Here, since structures of dielectric layers 111 and first to fourth external electrodes 131', 132', 133, and 134 are similar to those in the third exemplary embodiment described above, a detailed description thereof will be omitted in order to avoid an overlapping description.

Referring to FIGS. 13A, 13B, and 14, first and second via grooves 129a and 129b may be formed in fifth and sixth surfaces 5 and 6 of a capacitor body 110' to extend in a Z direction, which is a stacking direction of the dielectric layers 111, so that both ends of second internal electrodes 129 in a Y direction are partially removed, respectively.

Third and fourth via grooves 128a and 128b may be formed in third and fourth surfaces 3 and 4 of the capacitor body 110' to extend in the Z direction, which is the stacking direction of the dielectric layers 111, so that both ends of first internal electrodes 128 in an X direction are partially removed, respectively.

First to fourth via electrodes 141', 142', 143, and 144 may be formed by filling the first to fourth via grooves 129a, 129b, 128a, and 128b with a conductive material or formed by castellation, respectively.

The second internal electrode 129 may be exposed to the third to sixth surfaces 3 to 6 of the capacitor body 110'.

Further, third and fourth via separation grooves 129c and 129d may be formed in opposite ends of the second internal electrodes 129 in the X direction.

The third and fourth via separation grooves 129c and 129d may be formed in the second internal electrodes 129 to be larger than the third and fourth via grooves 128a and 128b and located at positions overlapping in the Z direction with the positions of the third and fourth via grooves 128a and 128b formed in the first internal electrodes 128 so that the second internal electrodes 129 do not contact the via electrodes 143 and 144 located in the third and fourth via grooves 128a and 128b.

The first internal electrodes 128 may be exposed to the third to sixth surfaces 3 to 6 of the capacitor body 110'.

Further, first and second via separation grooves 128c and 128d may be formed in opposite ends of the first internal electrodes 128 in the Y direction.

The first and second via separation grooves 128c and 128d may be formed in the first internal electrodes 128 to be larger than the first and second via grooves 129a and 129b and to be located at positions overlapping in the Z direction with positions of the first and second via grooves 129a and 129b formed in the second internal electrodes 129 so that the first internal electrodes 128 do not contact the via electrodes 141' and 142' formed in the first and second via grooves 129a and 129b.

Therefore, the first and second via electrodes 141' and 142' may contact the first and second via grooves 129a and 129b to electrically connect the plurality of second internal electrodes 129 to each other in the Z direction, and may be spaced apart from the first internal electrodes 128 by the first and second via separation grooves 128c and 128d, such that the first and second via electrodes 141' and 142' may not be electrically connected to the first internal electrodes 128.

The third and fourth via electrodes 143 and 144 may contact the third and fourth via grooves 128a and 128b to electrically connect the plurality of first internal electrodes 128 to each other in the Z direction, and may be spaced apart from the second internal electrodes 129 by the third and fourth via separation grooves 129c and 129d, such that the third and fourth via electrodes 143 and 144 may not be electrically connected to the second internal electrodes 129.

The first and second external electrodes 131' and 132' may be formed on a first surface 1 of the capacitor body 110' to be spaced apart from each other in the X direction, and connected to lower end portions of the third and fourth via electrodes 143 and 144, respectively.

The third and fourth external electrodes 133 and 134 may be formed on the first surface 1 of the capacitor body 110' to be spaced apart from each other in the Y direction, and connected to lower end portions of the first and second via electrodes 141' and 142', respectively.

In addition, an insulating part 155 may be formed on the third to sixth surfaces 3 to 6 of the capacitor body 110'.

The insulating part 155 as described above may cover ends of the first and second internal electrodes 128 and 129 exposed to the third to sixth surfaces 3 to 6 of the capacitor body 110', portions of the first and second via electrodes 141' and 142' exposed to the third and fourth surfaces 3 and 4 of the capacitor body 110', and portions of the third and fourth via electrodes 143 and 144 exposed to the fifth and sixth surfaces 5 and 6 of the capacitor body 110' to insulate the exposed ends of the first and second internal electrodes 128 and 129, the exposed portions of the first and second via electrodes 141' and 142', and the exposed portions of the third and fourth via electrodes 143 and 144.

Board Having Multilayer Capacitor

Figure 15:
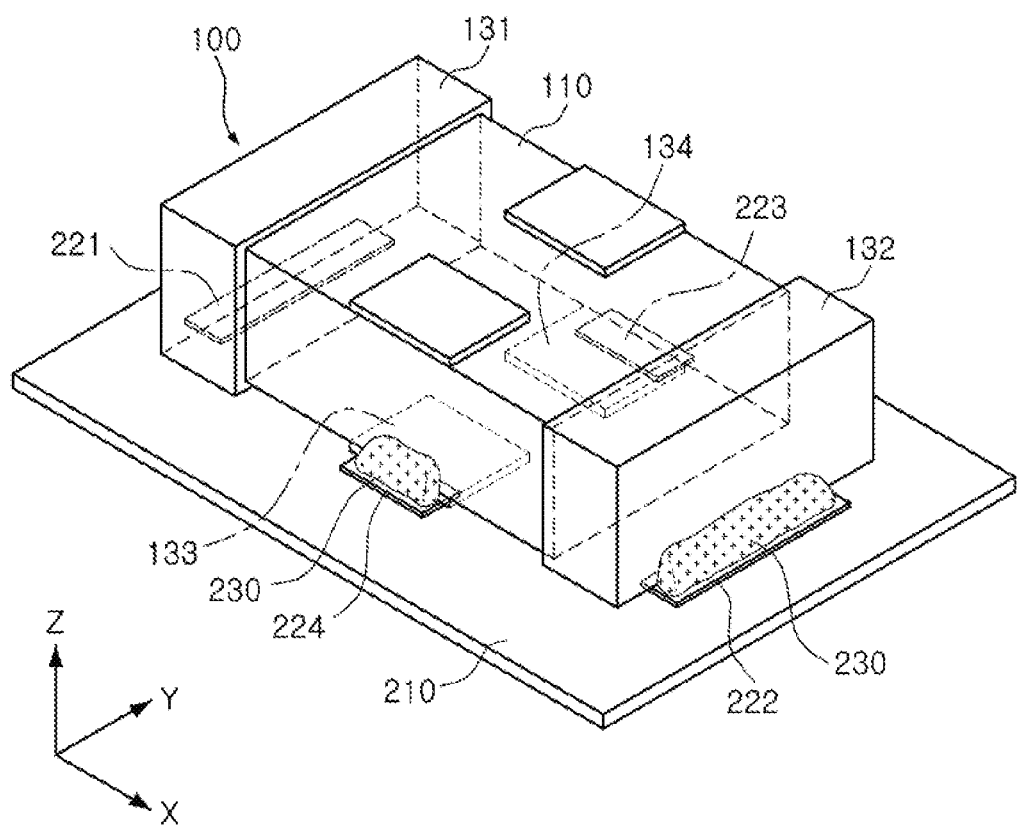
FIG. 15 is a perspective view illustrating a board in which the multilayer capacitor of FIG. 1 is mounted on a circuit board.

Referring to FIG. 15, a board having a multilayer capacitor according to the present exemplary embodiment may include a circuit board 210 on which the multilayer capacitor 100 is mounted, and first and second electrode pads 221 and 222 disposed to be spaced apart from each other in the X direction and third and fourth electrode pads 223 and 224 disposed to be spaced apart from each other in the Y direction on an upper surface of the circuit board 210.

The first and second external electrodes 131 and 132 may be fixed by solder 230 in a state in which they are positioned to contact the first and second electrode pads 221 and 222, and the third and fourth external electrodes 133 and 134 may be fixed by the solder 230 in a state in which they are positioned to contact the third and fourth electrode pads 223 and 224, such that the multilayer capacitor 100 may be electrically connected to the circuit board 210.

Meanwhile, although the board in which the multilayer capacitor of FIG. 1 is mounted on the circuit board is illustrated in FIG. 15, the board is not limited thereto. That is, the capacitor according to another exemplary embodiment may also be mounted on the circuit board in a similar structure, thereby configuring a board having a multilayer capacitor.

As set forth above, according to exemplary embodiments, ESL may be decreased, and the size of the product may be decreased to be smaller than the 1005 size.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
a capacitor body including dielectric layers and a plurality of first and second internal electrodes alternately disposed with one of the dielectric layers interposed between each pair of adjacent first and second internal electrodes, and the capacitor body having first and second surfaces opposing each other, third and fourth surfaces connected to the first and second surfaces and opposing each other, and fifth and sixth surfaces connected to the first and second surfaces and the third and fourth surfaces and opposing each other, opposing ends of the first internal electrodes being exposed to the third and fourth surfaces, respectively;
first and second via electrodes penetrating through the plurality of second internal electrodes to thereby have ends exposed to the first surface of the capacitor body, and disposed along the fifth and sixth surfaces of the capacitor body, respectively, to be spaced apart from each other;
first and second external electrodes disposed on the third and fourth surfaces of the capacitor body and respectively connected to opposing ends of the first internal electrodes; and
third and fourth external electrodes disposed on the first surface of the capacitor body to be spaced apart from each other, and connected to end portions of the first and second via electrodes, respectively.

2. The multilayer capacitor of claim 1, wherein the capacitor body includes first and second via grooves extending in a stacking direction of the dielectric layers so that opposing ends of the second internal electrodes are partially removed,
the first and second via electrodes are disposed in the first and second via grooves, respectively, and
first and second via separation grooves are provided in the first internal electrodes to be larger than the first and second via grooves and located at positions in the first internal electrodes corresponding to positions of the first and second via grooves in the second internal electrodes.

3. The multilayer capacitor of claim 1, wherein each second internal electrode includes a body portion disposed to be spaced apart from edges of the capacitor body, and first and second lead portions extended from the body portion to be exposed to the fifth and sixth surfaces of the capacitor body, respectively,
first and second via grooves are respectively disposed in the fifth and sixth surfaces of the capacitor body and extend in a stacking direction of the dielectric layers, so that ends of the first and second lead portions are partially removed,
the first and second via electrodes are disposed in the first and second via grooves, respectively,
the first internal electrode is disposed so as not to overlap the first and second via grooves, and
the multilayer capacitor further comprises an insulating part disposed on the fifth and sixth surfaces of the capacitor body.

4. The multilayer capacitor of claim 1, wherein the first and second external electrodes extend to portions of the first surface of the capacitor body.

5. The multilayer capacitor body of claim 1, wherein the first and second via electrodes are exposed to the second surface of the capacitor body, and the third and fourth external electrodes are further disposed on the second surface of the capacitor body to thereby be connected to the other end portions of the first and second via electrodes, respectively.

6. A multilayer capacitor comprising:
a capacitor body including dielectric layers and a plurality of first and second internal electrodes alternately disposed with one of the dielectric layers interposed between each pair of adjacent first and second internal electrodes, and the capacitor body having first and second surfaces opposing each other, third and fourth surfaces connected to the first and second surfaces and opposing each other, and fifth and sixth surfaces connected to the first and second surfaces and the third and fourth surfaces and opposing each other;
first and second via electrodes penetrating through the plurality of second internal electrodes to thereby be exposed to the first surface of the capacitor body, and disposed to be spaced apart from each other;
third and fourth via electrodes penetrating through the plurality of first internal electrodes to thereby be exposed to the first surface of the capacitor body, and disposed to be spaced apart from each other;
first and second external electrodes disposed on the first surface of the capacitor body to be spaced apart from each other, and connected to end portions of the third and fourth via electrodes, respectively; and
third and fourth external electrodes disposed on the first surface of the capacitor body to be spaced apart from each other, and connected to end portions of the first and second via electrodes, respectively.

7. The multilayer capacitor of claim 6, wherein the capacitor body includes first and second via grooves extending in a stacking direction of the dielectric layers so that opposing ends of the second internal electrodes are partially removed, and third and fourth via grooves disposed in the third and fourth surfaces of the capacitor body and extending in the stacking direction of the dielectric layers so that opposing ends of the first internal electrodes are partially removed,
the first to fourth via electrodes are disposed in the first to fourth via grooves, respectively,
the second internal electrodes are disposed to be spaced apart from edges of the capacitor body and not to overlap the third and fourth via grooves,
opposite ends of each first internal electrode are exposed to the third and fourth surfaces of the capacitor body, and first and second via separation grooves are formed in the first internal electrodes to be larger than the first and second via grooves and disposed in the first internal electrodes at positions corresponding to positions of the first and second via grooves in the second internal electrodes, and
the multilayer capacitor further comprises an insulating part disposed on third and fourth surfaces of the capacitor body.

8. The multilayer capacitor of claim 6, wherein the capacitor body includes first and second via grooves extending in a stacking direction of the dielectric layers so that opposing ends of the second internal electrodes are partially removed, and third and fourth via grooves disposed to be spaced apart from each other while penetrating through the plurality of first internal electrodes,
the first to fourth via electrodes are disposed in the first to fourth via grooves, respectively, the second internal electrodes are disposed to be spaced apart from edges of the capacitor body, and third and fourth via separation grooves are formed in the second internal electrodes to be larger than the third and fourth via grooves and disposed in the second internal electrodes at positions corresponding to positions of the third and fourth via grooves in the first internal electrodes, and the first internal electrodes are disposed to be spaced apart from the edges of the capacitor body, and first and second via separation grooves are formed in the first internal electrodes to be larger than the first and second via grooves and disposed in the first internal electrodes at positions corresponding to positions of the first and second via grooves in the second internal electrodes.

9. The multilayer capacitor of claim 6, wherein first and second via grooves are disposed in the fifth and sixth surfaces of the capacitor body, respectively, and extend in a stacking direction of the dielectric layers, so that opposing ends of the second internal electrodes are partially removed, and third and fourth via grooves are disposed in the third and fourth surfaces of the capacitor body, respectively, and extend in the stacking direction of the dielectric layers so that opposing ends of the first internal electrodes are partially removed, the first to fourth via electrodes are formed in the first to fourth via grooves, respectively, the second internal electrodes are exposed to edges of the capacitor body, and third and fourth via separation grooves are disposed in the second internal electrodes to be larger than the third and fourth via grooves and disposed in the second internal electrodes at positions corresponding to positions of the third and fourth via grooves in the first internal electrodes, the first internal electrodes are exposed to the edges of the capacitor body, and first and second via separation grooves are disposed in the first internal electrodes to be larger than the first and second via grooves and disposed in the first internal electrodes at positions corresponding to positions of the first and second via grooves in the second internal electrodes, and the multilayer capacitor further comprises an insulating part disposed on the third to sixth surfaces of the capacitor body.

10. A board having a multilayer capacitor, the board comprising:

a circuit board on which first to fourth electrode pads are disposed to be spaced apart from each other; and the multilayer capacitor of claim 1, mounted on the circuit board so that the first to fourth external electrodes are connected to the first to fourth electrode pads, respectively.

11. A board having a multilayer capacitor, the board comprising:

a circuit board on which first to fourth electrode pads are disposed to be spaced apart from each other; and the multilayer capacitor of claim 6, mounted on the circuit board so that the first to fourth external electrodes are connected to the first to fourth electrode pads, respectively.

12. A multilayer capacitor comprising:

a capacitor body including dielectric layers and pluralities of first and second internal electrodes alternately stacked with one of the dielectric layers interposed between each pair of adjacent first and second internal electrodes; and first, second, third, and fourth external electrodes disposed on at least one surface of the capacitor body, the first and second external electrodes electrically connected to the first internal electrodes and the third and fourth external electrodes electrically connected to the second internal electrodes, wherein the capacitor body includes first and second via electrodes spaced apart from each other in the capacitor body, wherein each of the second internal electrodes of the plurality of second internal electrodes contacts both of the first and second via electrodes, and wherein the third and fourth external electrodes are disposed on a same surface of the capacitor body to be spaced apart from each other, and respectively contact an end portion of the first and second via electrodes.

13. The multilayer capacitor of claim 12, wherein the first and second via electrodes are disposed on different external surfaces of the capacitor body.

14. The multilayer capacitor of claim 12, wherein the capacitor body includes side surfaces that are adjacent to the same surface of the capacitor body on which the third and fourth external electrodes are disposed, and the first and second via electrodes are spaced apart from each of the side surfaces of the capacitor body.

15. The multilayer capacitor of claim 12, wherein the capacitor body includes third and fourth via electrodes spaced apart from each other in the capacitor body, wherein each of the first internal electrodes of the plurality of first internal electrodes contacts both of the third and fourth via electrodes, and wherein the first, second, third, and fourth external electrodes are disposed on the same surface of the capacitor body to be spaced apart from each other, and the first and second external electrodes respectively contact an end portion of the third and fourth via electrodes.

16. The multilayer capacitor of claim 15, wherein the first, second, third, and fourth via electrodes are disposed on different external surfaces of the capacitor body other than the same surface of the capacitor body having the first, second, third, and fourth external electrodes thereon.

17. The multilayer capacitor of claim 15, wherein the capacitor body includes side surfaces that are adjacent to the same surface of the capacitor body on which the first, second, third, and fourth external electrodes are disposed, and the first, second, third, and fourth via electrodes are spaced apart from each of the side surfaces of the capacitor body.

18. A multilayer capacitor comprising:

a capacitor body including dielectric layers and pluralities of first and second internal electrodes alternately stacked with one of the dielectric layers interposed between each pair of adjacent first and second internal electrodes, wherein the capacitor body includes first and second via electrodes disposed in the capacitor body and each contacting each of the second internal electrodes, the first and second via electrodes being spaced apart from each other along a first direction orthogonal to a stacking direction of the dielectric layers, and wherein the first internal electrodes are interconnected by third and fourth via electrodes each contacting each of the first internal electrodes, the third and fourth via electrodes being spaced apart from each other along a second direction orthogonal to the stacking direction of the dielectric layers and to the first direction.

19. The multilayer capacitor of claim 18, wherein each of the first internal electrodes extends to two surfaces of the capacitor body disposed opposite each other along the second direction.

20. The multilayer capacitor of claim 18, wherein the third and fourth via electrodes are disposed in the capacitor body.

21. The multilayer capacitor of claim 18, wherein each of the first internal electrodes extends to two surfaces of the capacitor body disposed opposite each other along the second direction, and the third and fourth via electrodes are disposed on the two surfaces of the capacitor body disposed opposite each other along the second direction.

22. The multilayer capacitor of claim 18, wherein the first and second via electrodes are disposed on two surfaces of the capacitor body disposed opposite each other along the first direction.

23. The multilayer capacitor of claim 18, wherein the first and second via electrodes are disposed in the capacitor body to be spaced apart from surfaces of the capacitor body disposed opposite each other along the first and second directions.

\* \* \* \* \*